United States Patent
Beng et al.

(10) Patent No.: US 10,330,703 B2
(45) Date of Patent: Jun. 25, 2019

(54) PROBE SYSTEMS AND METHODS INCLUDING ELECTRIC CONTACT DETECTION

(71) Applicant: Cascade Microtech, Inc., Beaverton, OR (US)

(72) Inventors: Sia Choon Beng, Singapore (SG); Kazuki Negishi, Beaverton, OR (US)

(73) Assignee: FormFactor Beaverton, Inc., Beaverton, OR (US)

( * ) Notice: Subject to any disclaimer, the term of this patent is extended or adjusted under 35 U.S.C. 154(b) by 0 days.

(21) Appl. No.: 15/934,672

(22) Filed: Mar. 23, 2018

(65) Prior Publication Data
US 2018/0284155 A1    Oct. 4, 2018

Related U.S. Application Data

(60) Provisional application No. 62/481,245, filed on Apr. 4, 2017.

(51) Int. Cl.
*G01R 31/28* (2006.01)
*G01R 1/073* (2006.01)
*G01R 1/067* (2006.01)

(52) U.S. Cl.
CPC ..... *G01R 1/07342* (2013.01); *G01R 1/06777* (2013.01); *G01R 31/2886* (2013.01)

(58) Field of Classification Search
CPC ............ G01R 1/07342; G01R 1/06794; G01R 1/07307; G01R 1/07385; G01R 31/2886; G01R 1/06777

(Continued)

(56) References Cited

U.S. PATENT DOCUMENTS 6,255,827 B1 *   7/2001   Farooq ............... G01R 1/06705
                                                         324/537
2008/0315903 A1   12/2008  Schmidt et al.
(Continued)

FOREIGN PATENT DOCUMENTS

TW          201245731 A      11/2012

OTHER PUBLICATIONS

English-language abstract of Taiwan Patent Publication No. TW201245731A, Nov. 16, 2012.

*Primary Examiner* — Amy He
(74) *Attorney, Agent, or Firm* — Dascenzo Intellectual Property Law, P.C.

(57) ABSTRACT

Probe systems and methods including electric contact detection. The probe systems include a probe assembly and a chuck. The probe systems also include a translation structure configured to operatively translate the probe assembly and/or the chuck and an instrumentation package configured to detect contact between the probe system and a device under test (DUT) and to test operation of the DUT. The instrumentation package includes a continuity detection circuit, a test circuit, and a translation structure control circuit. The continuity detection circuit is configured to detect electrical continuity between a first probe electrical conductor and a second probe electrical conductor. The test circuit is configured to electrically test the DUT. The translation structure control circuit is configured to control the operation of the translation structure. The methods include monitoring continuity between a first probe and a second probe and controlling the operation of a probe system based upon the monitoring.

21 Claims, 3 Drawing Sheets

(58) Field of Classification Search
USPC ............... 324/754.1, 754.11, 754.03, 754.07
See application file for complete search history.

(56) References Cited

U.S. PATENT DOCUMENTS

| | | |
|---|---|---|
| 2010/0045313 A1 | 2/2010 | Sleijpen et al. |
| 2013/0113509 A1* | 5/2013 | Wu .................... G01R 31/2874 324/750.03 |
| 2014/0253162 A1 | 9/2014 | Wang et al. |

* cited by examiner

PROBE SYSTEMS AND METHODS INCLUDING ELECTRIC CONTACT DETECTION

RELATED APPLICATION

This application claims priority to U.S. Provisional Patent Application No. 62/481,245, which was filed on Apr. 4, 2017, and the complete disclosure of which is hereby incorporated by reference.

FIELD OF THE DISCLOSURE

The present disclosure relates generally to probe systems and methods including electric contact detection.

BACKGROUND OF THE DISCLOSURE

Probe systems may be utilized to test the operation, or functionality, of a device under test. Such probe systems often include a plurality of probes configured to electrically contact one or more contact locations on a device under test (DUT). In such probe systems, it may be desirable to determine and/or quantify whether or not electrical contact has been established between the plurality of probes and the one or more contact locations. Historically, optical observation techniques have been utilized to monitor physical contact, which may correlate to electrical contact. While such optical observation techniques may be effective in certain probe systems, other probe systems may include structures that limit and/or restrict optical observation of the physical contact. As an example, a probe system may include an anti-arcing probe card configured to resist electrical arcing between the anti-arcing probe card and the DUT. Such an anti-arcing probe card may, together with a substrate that includes the DUT, define a partially enclosed volume that includes the plurality of probes, and the anti-arcing probe card may restrict, or block, optical observation of the plurality of probes and/or of the DUT. In other instances, the probe card is positioned perpendicular to the DUT such that it is not possible visually to observe the probe tips. As another example, physical contact may not always correlate to, or indicate, electrical contact. Thus, there exists a need for improved probe systems and methods including electric contact detection.

SUMMARY OF THE DISCLOSURE

Probe systems and methods including electric contact detection. The probe systems include a probe assembly, which includes a first probe and a second probe, and a chuck, which includes a support surface configured to support a device under test (DUT). The probe systems also include a translation structure and an instrumentation package. The translation structure is configured to operatively translate the probe assembly and/or the chuck. The instrumentation package is configured to detect contact between the probe system and the DUT and also to test operation of the DUT. The probe systems further include a first probe electrical conductor, which electrically interconnects the first probe and the instrumentation package, a second probe electrical conductor, which electrically interconnects the second probe and the instrumentation package, and a translation structure communication linkage, which extends between the translation structure and the instrumentation package. The instrumentation package includes a continuity detection circuit, a test circuit, and a translation structure control circuit. The continuity detection circuit is in electrical communication with, and is configured to detect electrical continuity between, the first probe electrical conductor and the second probe electrical conductor. The test circuit is configured to electrically test the DUT. The translation structure control circuit is configured to control the operation of the translation structure based upon the continuity detection circuit.

The methods include monitoring a continuity between a first probe and a second probe of a probe assembly. During the monitoring, the methods include operatively translating the substrate and the probe assembly toward one another to establish electrical contact between a contact location of the DUT and both the first probe and the second probe. Responsive to the electrical contact, the methods include detecting continuity between the first probe and the second probe. Responsive to the detecting, the methods include ceasing the operatively translating. Subsequent to the ceasing, the methods include utilizing the first probe and the second probe to electrically test operation of the DUT.

DETAILED DESCRIPTION AND BEST MODE OF THE DISCLOSURE

Figure 1:
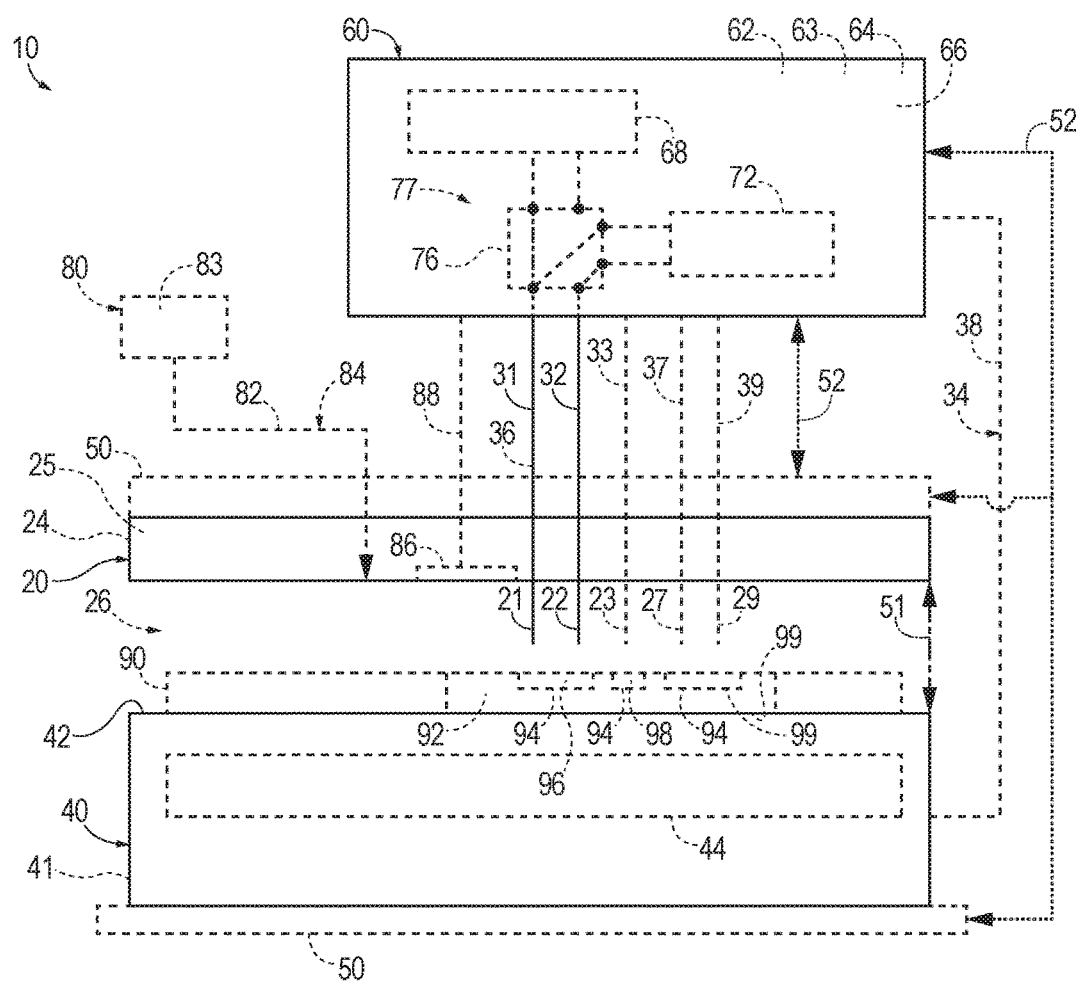
FIG. 1 is a schematic representation illustrating examples of probe systems, according to the present disclosure, prior to electrical contact between a probe assembly and a device under test.
Figure 2:
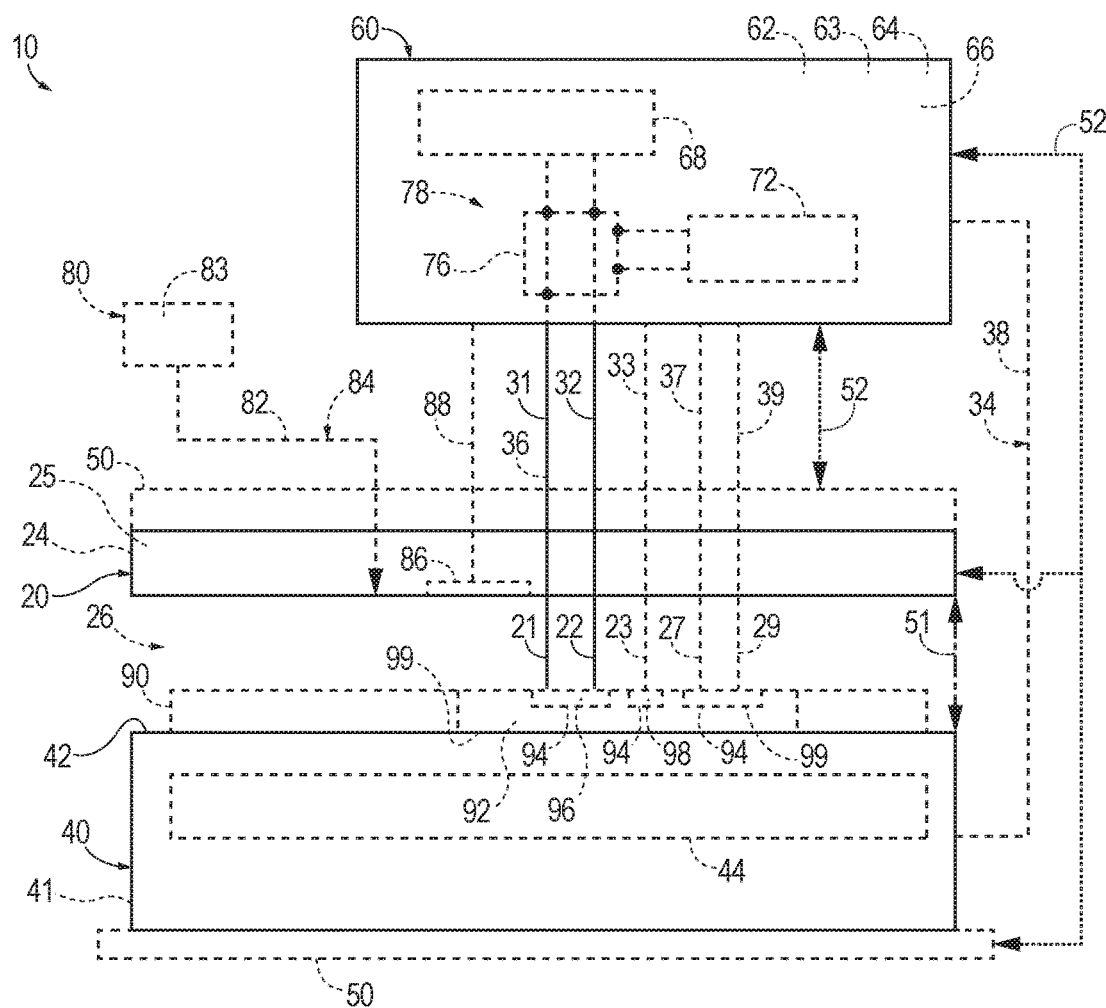
FIG. 2 is a schematic representation illustrating the probe systems of FIG. 1 subsequent to electrical contact between the probe assembly and the device under test.
Figure 3:
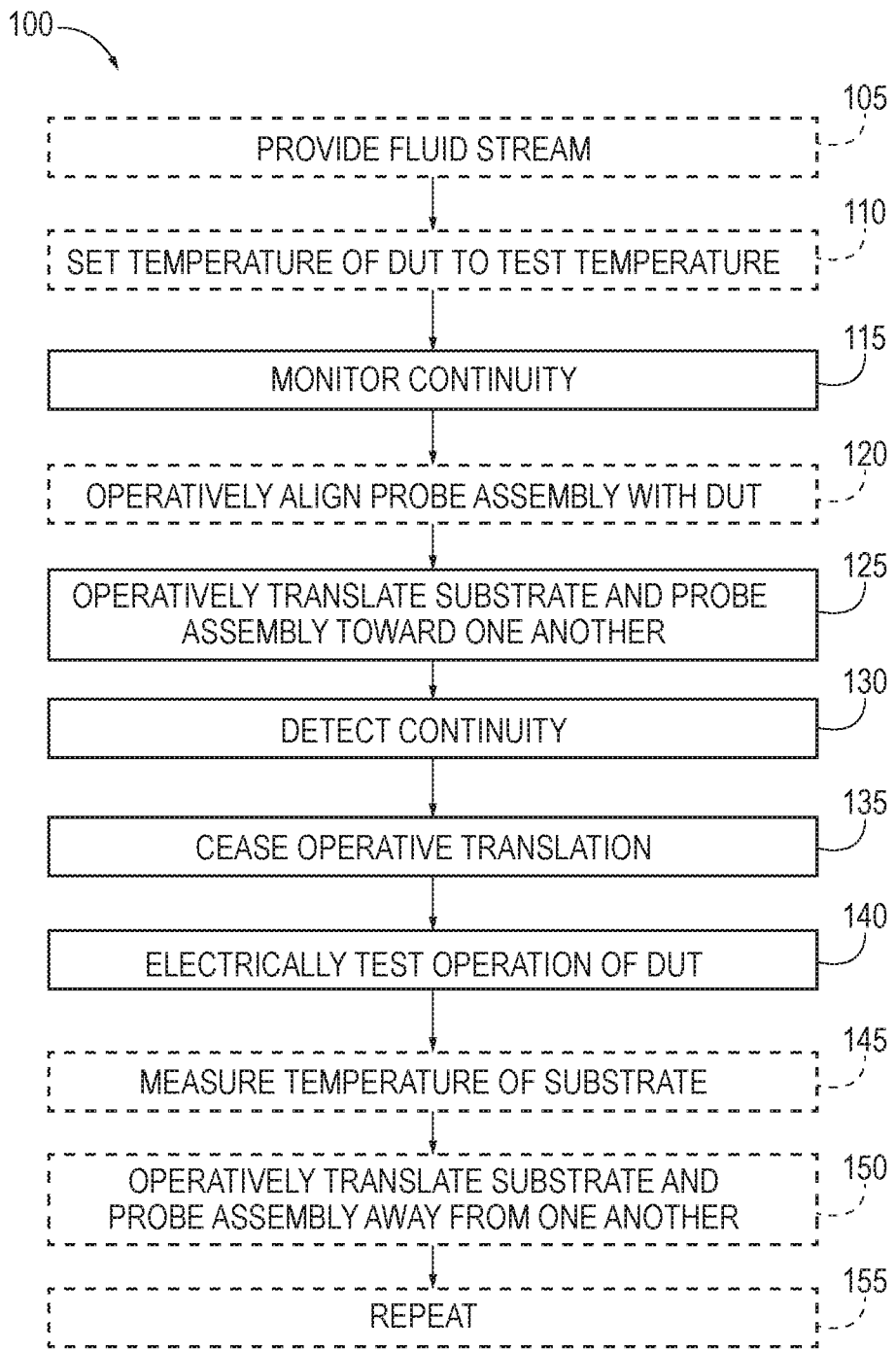
FIG. 3 is a flowchart depicting examples of methods, according to the present disclosure, of electrically testing a plurality of devices under test.

FIGS. 1-3 provide examples of probe systems 10 and/or of methods 100, according to the present disclosure. Elements that serve a similar, or at least substantially similar, purpose are labeled with like numbers in each of FIGS. 1-3, and these elements may not be discussed in detail herein with reference to each of FIGS. 1-3. Similarly, all elements may not be labeled in each of FIGS. 1-3, but reference numerals associated therewith may be utilized herein for consistency. Elements, components, and/or features that are discussed herein with reference to one or more of FIGS. 1-3 may be included in and/or utilized with any of FIGS. 1-3 without departing from the scope of the present disclosure. In general, elements that are likely to be included in a particular embodiment are illustrated in solid lines, while elements that are optional are illustrated in dashed lines. However, elements that are shown in solid lines may not be essential and, in some embodiments, may be omitted without departing from the scope of the present disclosure.

FIG. 1 is a schematic representation illustrating examples of probe systems 10, according to the present disclosure, prior to electrical contact between a probe assembly 20 and a device under test (DUT) 92. FIG. 2 is a schematic representation illustrating probe systems 10 subsequent to electrical contact between the probe assembly and the DUT. Probe systems 10 may be configured to electrically test DUT 92, such as to test, quantify, and/or verify operation, functionality, and/or performance of the DUT.

As illustrated in solid lines in FIGS. 1-2, probe assembly 20 of probe system 10 includes a plurality of probes. The plurality of probes may include and/or be a first probe 21 and/or a second probe 22. As discussed in more detail herein, the plurality of probes also may, but is not required to, include a third probe 23, a fourth probe 27, and/or a fifth probe 29.

First probe 21 and second probe 22 may be configured to be operatively aligned with and to electrically contact the same, or a single, contact location 94 on DUT 92. Probe systems 10 also include a chuck 40. Chuck 40 includes and/or defines a support surface 42, and the support surface is configured to support DUT 92 and/or a substrate 90 that includes DUT 92.

Probe systems 10 further include a translation structure 50. Translation structure 50 is illustrated in dashed lines in FIGS. 1-2 to indicate that the translation structure may be associated with and/or operatively attached to chuck 40 and/or probe assembly 20. The translation structure may be configured to operatively translate probe assembly 20 and/or chuck 40 along a contacting axis 51, such as to permit and/or facilitate selective contact between the plurality of probes and the contact location. As illustrated, contacting axis 51 may be perpendicular, or at least substantially perpendicular, to support surface 42.

Probe systems 10 also include an instrumentation package 60. The instrumentation package is configured to detect, determine, and/or sense contact, or electrical contact, between probe system 10, or the plurality of probes thereof, and DUT 92. Subsequent to contact between the probe system and the DUT, instrumentation package 60 also is configured to test the operation of the DUT.

Probe systems 10 further include a plurality of probe electrical conductors. The plurality of probe electrical conductors may include and/or be a first probe electrical conductor 31, a second probe electrical conductor 32, and/or a translation structure communication linkage 52. The plurality of probe electrical conductors also may, but is not required to, include a third, or a gate, probe electrical conductor 33, a fourth probe electrical conductor 37, and/or a fifth probe electrical conductor 39.

First probe electrical conductor 31 extends between, and electrically interconnects, first probe 21 and instrumentation package 60. Second probe electrical conductor 32 extends between, and electrically interconnects, second probe 22 and instrumentation package 60. Translation structure communication linkage 52 provides communication between translation structure 50 and instrumentation package 60.

Instrumentation package 60 includes a continuity detection circuit 62, a test circuit 64, and a translation structure control circuit 66. Continuity detection circuit 62 is in electrical communication with both first probe electrical conductor 31 and second probe electrical conductor 32. In addition, continuity detection circuit 62 is configured to detect electrical contact between contact location 94 and both first probe 21 and second probe 22 by detecting electrical continuity between the first probe electrical conductor and the second probe electrical conductor. Test circuit 64 is configured to test the operation of DUT 92. Translation structure control circuit 66 is configured to control the operation of translation structure 50 based, at least in part, on continuity detection circuit 62.

During operation of probe system 10, and prior to contact between probe assembly 20 and DUT 92, first probe 21 and second probe 22 may be operatively aligned with contact location 94. This operative alignment may be in a plane of support surface 42 and/or in a plane that is perpendicular to contacting axis 51 and is illustrated in FIG. 1. In addition, this operative alignment may be accomplished and/or facilitated by, via, and/or utilizing translation structure 50 to move, translate, and/or rotate probe assembly 20 and/or chuck 40 in the plane that is perpendicular to contacting axis 51 and/or in the plane of support surface 42.

Subsequently, translation structure control circuit 66 may control translation structure 50, which may be utilized to establish electrical contact between contact location 94 and both first probe 21 and second probe 22. As an example, translation structure 50 may be utilized to move DUT 92 toward probe assembly 20 and/or to move probe assembly 20 toward DUT 92. Contact location 94 may be electrically conductive. As such, electrical contact between the contact location and both the first probe and the second probe may establish an electrically conductive linkage, short, and/or shunt between the first probe and the second probe, thereby establishing continuity between the first probe and the second probe.

With this in mind, and during the motion of the probe assembly and/or of the DUT along contacting axis 51, continuity detection circuit 62 may be utilized to watch for, to detect, to sense, and/or to indicate the electrical contact via detection of continuity between the first probe and the second probe. Responsive to continuity detection circuit 62 indicating, or detecting, continuity between first probe 21 and second probe 22, translation structure control circuit 66 may cease the motion of the probe assembly and/or of the DUT toward one another and/or along the contacting axis. Subsequently, test circuit 64 may test the operation of DUT 92, such as by sending one or more test signals 36 to the DUT and/or by receiving one or more resultant signals 38 from the DUT.

Probe assembly 20 may include any suitable structure that includes first probe 21 and second probe 22. As an example, probe assembly 20 may include, or be, a probe card 24 and/or an anti-arcing probe card 25.

As discussed, first probe 21 and second probe 22 are configured to contact the same, or a single, contact location 94 on DUT 92, thereby permitting continuity detection circuit 62 to detect the contact via detection of continuity between the first probe and the second probe. As an example, first probe 21 may include, or be, a force probe 21 of probe assembly 20, second probe 22 may include, or be, a sense probe 22 of probe assembly 20, and contact location 94 may be a source contact location 96 of DUT 92.

Under these conditions, and during testing of DUT 92, force probe 21 may be configured to provide an electric current to the source contact location while sense probe 22 may be configured to detect an electric potential of the source contact location. In addition, and as illustrated in dashed lines in FIGS. 1-2, probe assembly 20 may include third probe 23, which also may be referred to herein as a gate probe 23 of probe assembly 20 and may be in electrical communication with instrumentation package 60 via third, or gate, probe electrical conductor 33. Gate probe 23 may be configured to electrically contact a gate contact location 98 of DUT 92, such as to permit instrumentation package 60 to selectively apply an electrical potential to the gate contact location via gate probe electrical conductor 33.

As further illustrated in dashed lines in FIGS. 1-2, probe assembly 20 may include fourth probe 27 and fifth probe 29. Fourth probe 27 and fifth probe 29 may be configured to electrically contact a single contact location 94, such as a drain contact location 99, and may be in electrical communication with instrumentation package 60 via fourth probe electrical conductor 37 and fifth probe electrical conductor 39, respectively. Under these conditions, first probe 21 also may be referred to herein as a source force probe 21, second probe 22 also may be referred to herein as a source sense probe 22, fourth probe 27 also may be referred to herein as a drain force probe 27, and fifth probe 29 also may be referred to herein as a drain sense probe 29. DUTs 92 that include source contact location 96, gate contact location 98, and drain contact location 99 also may be referred to herein as lateral devices. In such lateral devices, a magnitude of an electrical potential applied to gate contact location 98 may control and/or regulate electric current flow between source contact location 96 and drain contact location 99.

Third probe 23, fourth probe 27, fifth probe 29, and/or drain contact location 99 are not required of all embodiments. As an example, a back side of substrate 90 may form drain contact location 99. DUTs 92 that have this configuration also may be referred to herein as vertical devices. In such vertical devices, the magnitude of the electrical potential applied to gate contact location 98 may control and/or regulate electric current flow between source contact location 96 and the back side of substrate 90.

As discussed, probe assembly 20 may include, be, and/or be referred to herein as anti-arcing probe card 25; and the anti-arcing probe card may be configured to resist arcing among force probe 21, sense probe 22, and/or gate probe 23 when probe system 10 electrically tests DUT 92. When probe assembly 20 includes the anti-arcing probe card, probe assembly 20 further may include a fluid supply system 80. Fluid supply system 80 may be configured to provide a fluid stream 82 to a region 26 that extends between anti-arcing probe card 25 and DUT 92. Fluid stream 82 also may be referred to herein as and/or may be a pressurized fluid stream, a gas stream, a pressurized gas stream, an air stream, a pressurized air stream, a liquid stream, and/or a pressurized liquid stream.

The fluid stream may be provided when, or while, the probe system electrically tests the DUT and may decrease a potential for arcing among first probe 21, second probe 22, third probe 23 (when present), fourth probe 27 (when present), and/or fifth probe 29 (when present), as described by Paschen's Law. Region 26 also may be referred to herein as, or may be, a partially enclosed volume 26, and anti-arcing probe card 25 may be configured to supply the fluid stream to the partially enclosed volume. The partially enclosed volume may be defined, bounded, and/or surrounded by substrate 90 and by probe assembly 20. However, and as illustrated in FIGS. 1-2, a gap, air gap, or space may separate the substrate and the probe assembly, thereby permitting fluid stream 82 to escape, or flow, from the partially enclosed volume.

Fluid supply system 80 may include, or be, any suitable structure. As examples, the fluid supply system may include one or more of a fluid source 83, which is configured to generate the fluid stream, and/or a fluid conduit 84, which extends between the fluid source and the anti-arcing probe card. It is within the scope of the present disclosure that fluid supply system 80 may be configured to supply fluid stream 82 at any suitable pressure. As examples, the pressure of the fluid stream may be at least 0.1 megapascals (MPa), at least 0.2 MPa, at least 0.3 MPa, at least 0.4 MPa, at least 0.5 MPa, at least 0.6 MPa, at most 1 MPa, at most 0.9 MPa, at most 0.8 MPa, at most 0.7 MPa, at most 0.6 MPa, and/or at most 0.5 MPa.

It also is within the scope of the present disclosure that fluid supply system 80 may be configured to supply fluid stream 82 at any suitable fluid temperature. This fluid temperature may be, or may be based upon, a test temperature for the DUT. Examples of the fluid temperature include fluid temperatures of at least −100° C., at least −80° C., at least −60° C., at least −40° C., at least −20° C., at least 0° C., at least 20° C., at least 40° C., at least 60° C., at most 600° C., at most 550° C., at most 500° C., at most 450° C., at most 400° C., at most 350° C., at most 300° C., at most 250° C., and/or at most 200° C.

Chuck 40 may include any suitable structure that defines support surface 42. As an example, chuck 40 may include, or be, a temperature-controlled chuck 41. Temperature-controlled chuck 41, when present, may include a chuck thermal module 44. The chuck thermal module may be configured to regulate, to selectively regulate, to vary, and/or to selectively vary a temperature of chuck 40, thereby regulating a temperature of substrate 90 and/or of DUT 92. This may include variation of the temperature of the chuck within a chuck temperature range. The chuck temperature range may include, or be bounded by, a minimum temperature of at most −200° C., at most −150° C., at most −100° C., at most −50° C., and/or at most 0° C. Additionally or alternatively, the chuck temperature range may include, or be bounded by, a maximum temperature of at least 50° C., at least 100° C., at least 150° C., at least 200° C., at least 250° C., or at least 300° C.

Translation structure 50 may include any suitable structure that may be adapted, configured, designed, and/or constructed to operatively translate probe assembly 20 and/or chuck 40 along contacting axis 51, such as to selectively establish and/or cease electrical contact between probe assembly 20 and DUT 92. This may include selectively establishing communication between the contact location of the DUT and both the first probe and the second probe by moving the probe assembly, along the contacting axis, toward the chuck and/or by moving the chuck, along the contacting axis, toward the probe assembly. This also may include selectively ceasing electrical communication between the contact location of the DUT and both the first probe and the second probe by moving the probe assembly, along the contacting axis, away from the chuck and/or by moving the chuck, along the contacting axis, away from the probe assembly.

Stated another way, translation structure 50 may include a chuck translation structure configured to operatively translate chuck 40 relative to probe assembly 20. Additionally or alternatively, translation structure 50 may include a probe assembly translation structure configured to operatively translate probe assembly 20 relative to chuck 40. Examples of translation structure 50 include any suitable linear actuator, rotary actuator, motor, stepper motor, rack and pinion assembly, lead screw and nut assembly, ball screw assembly, and/or piezoelectric actuator.

Continuity detection circuit 62 may include and/or be any suitable circuit that may be configured to detect continuity between first probe 21 and second probe 22. As an example, continuity detection circuit 62 may be configured to establish a contact-sensing voltage differential between first probe 21 and second probe 22. Under these conditions, continuity detection circuit 62 further may be configured to detect electric current flow that is initiated, or permitted, when continuity is established between the first probe and the second probe. Examples of the contact-sensing voltage differential include voltage differentials having a minimum contact-sensing voltage of at least 0.1 volts (V), at least 0.2 V, at least 0.4 V, at least 0.6 V, at least 0.8 V, at least 1 V, at least 2 V, and/or at least 5 V. Additional examples of the contact-sensing voltage differential include voltage differentials having a maximum contact-sensing voltage of at most 20 V, at most 15 V, at most 10 V, at most 7.5 V, at most 5 V, at most 2.5V, and/or at most 1 V.

Continuity detection circuit 62 further may be configured to generate a contact signal 63, which is indicative of a state of contact between contact location 94 and both first probe 21 and second probe 22. Under these conditions, translation structure control circuit 66 may be configured to control the operation of translation structure 50 based, at least in part, on the contact signal.

Test circuit 64 may include and/or be any suitable circuit that may be configured to electrically test the operation of DUT 92. As examples, test circuit 64 may be configured to provide test signal 36 to the DUT, receive resultant signal 38 from the DUT, and/or quantify the operation of the DUT based, at least in part, on the test signal and/or on the resultant signal.

It is within the scope of the present disclosure that test signal 36 may include, or be, a high voltage test signal 36. Examples of the high-voltage test signal include high-voltage test signals having a minimum test voltage of at least 0.5 kilovolts (kV), at least 1 kV, at least 2 kV, at least 4 kV, at least 6 kV, at least 8 kV, and/or at least 10 kV. Additional examples of the high-voltage test signal include high-voltage test signals having a maximum test voltage of at most 20 kV, at most 15 kV, at most 12.5 kV, at most 10 kV, at most 7.5 kV, and/or at most 5 kV.

It is within the scope of the present disclosure that instrumentation package 60 additionally or alternatively may include any suitable structure that may be configured and/or utilized to test the operation of DUT 92, that may at least partially control the operation of translation structure 50, and/or that may detect contact between contact location 94 and both first probe 21 and second probe 22. Examples of such structures include continuity detection circuit 62, test circuit 64, and translation structure control circuit 66, which are discussed herein.

As additional examples, instrumentation package 60 may include, or may instead include, a measurement instrument 68, a contact-sensing assembly 72, and a switch 76. Measurement instrument 68 may be configured to electrically test DUT 92 and/or may be an example of test circuit 64. Contact-sensing assembly 72 may be configured to detect electrical contact between contact location 94 and both first probe 21 and second probe 22, and an example of the contact-sensing assembly includes continuity detection circuit 62.

Switch 76 may be configured to be selectively switched between a contact-sensing state 77, as illustrated in FIG. 1, and a testing state 78, as illustrated in FIG. 2. When in the contact-sensing state of FIG. 1, switch 76 electrically interconnects first probe electrical conductor 31 and/or second probe electrical conductor 32 with contact-sensing assembly 72, and switch 76 electrically isolates first probe electrical conductor 31 and/or second probe electrical conductor 32 from measurement instrument 68. Stated another way, and when in contact-sensing state 77, switch 76 electrically interconnects at least one of first probe electrical conductor 31 and second probe electrical conductor 32 with contact-sensing assembly 72, and switch 76 electrically isolates at least one of first probe electrical conductor 31 and second probe electrical conductor 32 from measurement instrument 68.

As an example, and as illustrated in dashed lines in FIG. 1, switch 76 may interconnect both the first probe electrical conductor and the second probe electrical conductor with the contact-sensing assembly when in contact-sensing state 77. Alternatively, and as illustrated in dash-dot lines in FIG. 1, switch 76 may maintain first probe electrical conductor 31 in electrical communication with measurement instrument 68 while interconnecting second probe electrical conductor 32 (or alternatively first probe electrical conductor 31) with contact-sensing assembly 72.

When in the testing state of FIG. 2, both first probe electrical conductor 31 and second probe electrical conductor 32 may be electrically interconnected with measurement instrument 68. Stated another way, switch 76 may electrically interconnect first probe electrical conductor 31 and/or second probe electrical conductor 32 with measurement instrument 68, and switch 76 may electrically isolate the first probe electrical conductor and/or the second probe electrical conductor from contact-sensing assembly 72. The specific switching action and/or configuration of switch 76 may vary depending upon whether contact-sensing state 77 of FIG. 1 interconnects one, or both, of first probe electrical conductor 31 and second probe electrical conductor 32 to contact-sensing assembly 72.

The presence of switch 76 may permit instrumentation package 60 to monitor contact between contact location 94 and both first probe 21 and second probe 22 utilizing a contact-sensing voltage signal that is significantly different from, or less than, a test signal, or a high-voltage test signal that may be utilized to test the operation of DUT 92. Stated another way, contact-sensing assembly 72 may be configured to generate the contact-sensing voltage differential between first probe 21 and second probe 22, measurement instrument 68 may be configured to generate the high-voltage test signal, and switch 76 may permit contact-sensing assembly 72 and measurement instrument 68 to selectively be placed into, and out of, electrical communication with first probe 21 and second probe 22. Such a configuration may permit both detection of contact and testing of the DUT while avoiding arcing between probe assembly 20 and the DUT, which may occur were the high-voltage test signal utilized to detect contact. Examples of the contact-sensing voltage differential and the high-voltage test signal are disclosed herein.

It is within the scope of the present disclosure that switch 76 further may include and/or define an isolation state in which the switch electrically isolates first probe electrical conductor 31 and second probe electrical conductor 32 from both contact-sensing assembly 72 and measurement instrument 68. Such a configuration may be utilized to facilitate setup and/or calibration of probe systems 10 that include switch 76. Additionally or alternatively, the isolation state may permit probe system 10 to test for and/or to quantify electrical leakage within switch 76.

As illustrated in dashed lines in FIGS. 1-2, probe system 10 also may include a drain electrical conductor 34. Drain electrical conductor 34 may be configured to electrically interconnect a back side of DUT 92 with instrumentation package 60 and/or with measurement instrument 68 thereof. As an example, support surface 42 may include, or be, an electrically conductive support surface, and drain electrical conductor 34 may electrically interconnect the electrically conductive support surface with the instrumentation package. Drain electrical conductor 34 may be configured to complete a circuit that permits test signal 36 to flow from instrumentation package 60 to DUT 92 via first probe electrical conductor 31 and first probe 21 and then back to the instrumentation package via the drain electrical conductor.

As discussed, switch 76 may be configured to be switched between conveying the test signal and conveying the contact-sensing voltage differential, which may differ significantly in magnitude. As such, switch 76 may be selected to have one or more properties that may be beneficial to the operation of probe system 10. As an example, switch 76 may be configured to convey high voltages, such as voltages up to the maximum test voltage. As another example, switch 76 may be configured to convey high electric currents, such as electric currents of at least 1 Amp (A), at least 10 A, at least 100 A, at least 500 A, and/or at least 1000 A. As yet another example, switch 76 may be configured to be remotely transitioned between contact-sensing state 77 of FIG. 1 and testing state 78 of FIG. 2. As another example, switch 76 may have a short switching time and/or a short settling time, such as a switching time and/or a settling time of less than 1 millisecond, less than 500 microseconds, less than 100 microseconds, and/or less than 1 microsecond.

As illustrated in dashed lines in FIGS. 1-2, probe assembly 20 may include a thermal detector 86. Thermal detector 86, when present, may be configured to detect a temperature of substrate 90 and/or of DUT 92. Examples of thermal detector 86 include a thermocouple, a thermistor, a resistance thermal detector (RTD), and/or an infrared detector. Thermal detector 86 may be configured to generate a thermal signal 88, and probe assembly 20 may be configured to convey the thermal signal to instrumentation package 60. Such a configuration may permit instrumentation package 60 to quantify the electrical performance of DUT 92 as a function of the temperature of the DUT.

As discussed, DUT 92 may be included in substrate 90. This may include DUTs 92 that are supported by, formed on, and/or formed within substrate 90. Examples of substrate 90 include any suitable wafer, semiconductor wafer, silicon wafer, and/or Group III-V semiconductor wafer. Examples of DUT 92 include any suitable solid-state device, integrated circuit device, circuit, and/or semiconductor device. Examples of contact locations 94, source contact locations 96, and/or gate contact locations 98 include any suitable contact pad and/or solder bump.

FIG. 3 is a flowchart depicting examples of methods 100, according to the present disclosure, of electrically testing a device under test (DUT), which is formed on a substrate, with a probe system, which includes a probe assembly. Methods 100 may include providing a fluid stream at 105 and/or setting a temperature of the DUT to a test temperature at 110. Methods 100 include monitoring continuity at 115 and may include operatively aligning the probe assembly with the DUT at 120. Methods 100 further include operatively translating the substrate and the probe assembly toward one another at 125, detecting continuity at 130, ceasing the operatively translating at 135, and electrically testing operation of the DUT at 140. Methods 100 further may include measuring a temperature of the substrate at 145, operatively translating the substrate and the probe assembly away from one another at 150, and/or repeating at least a portion of the methods at 155.

Providing a fluid stream at 105 may include providing the fluid stream to a region, or to a pressurized region, that extends between the probe assembly and the DUT and/or providing to resist, or to reduce a potential for, arcing during the electrically testing at 140. The providing at 105 may include providing with, via, and/or utilizing any suitable structure, such as pressurized fluid supply system 80 of FIGS. 1-2. Examples of the pressurized region are disclosed herein with reference to region 26 of FIGS. 1-2.

Setting a temperature of the DUT to a test temperature at 110 may include setting the temperature of the DUT to any suitable, selected, and/or predetermined test temperature. When methods 100 include the setting at 110, the setting at 110 may be performed prior to the electrically testing at 140. The setting at 110 may include setting the temperature of the DUT with, via, and/or utilizing any suitable structure, such as temperature-controlled chuck 41, chuck thermal module 44, and/or thermal detector 86 of FIGS. 1-2.

Monitoring continuity at 115 may include monitoring continuity between a first probe of the probe system and a second probe of the probe system. The first probe and the second probe may form a portion of the probe assembly, and examples of the probe assembly are disclosed herein with reference to probe assembly 20 of FIGS. 1-2. Examples of the probe system are disclosed herein with reference to probe system 10 of FIGS. 1-2.

The substrate may include a plurality of DUTs, and the operatively aligning at 120 may include operatively aligning the probe assembly with any suitable given DUT, selected DUT, and/or first DUT of the plurality of DUTs. The operatively aligning at 120 may include operatively aligning at least the first probe and the second probe with a corresponding, or single, contact location on the DUT. Additionally or alternatively, the operatively aligning at 120 may include operatively aligning in, or within, a plane that is parallel to a surface of the substrate that faces toward the probe assembly.

Operatively translating the substrate and the probe assembly toward one another at 125 may include operatively translating to establish, to initiate, to produce, and/or to effect electrical contact between the contact location, or the corresponding contact location, of the DUT and both the first probe and the second probe. This may include operatively translating along a contacting axis, such as contacting axis 51 of FIGS. 1-2, that is perpendicular, or at least substantially perpendicular, to the surface of the substrate that faces toward the probe assembly. In order to facilitate the detecting at 130, the operatively translating at 125 is performed during, concurrently with, and/or at least partially concurrently with the monitoring at 115. As an example, the monitoring at 115 may be performed continuously, at least substantially continuously, and/or with a specified, or predetermined, frequency during the operatively translating at 125. FIG. 1 illustrates probe system 10 subsequent to the operatively aligning at 120 and prior to the operatively translating at 125, while FIG. 2 illustrates probe system 10 subsequent to the operatively aligning at 120 and also subsequent to the operatively translating at 125.

Detecting continuity at 130 may include detecting continuity between the first probe and the second probe. The detecting at 130 may be responsive to, or a result of, electrical contact being established between the contact location and both the first probe and the second probe during the operatively translating at 125. As an example, and as discussed in more detail herein with reference to FIGS. 1-2, the contact location may be electrically conductive. Thus, electrical contact between the contact location and both the first probe and the second probe may short, or shunt, the first probe and the second probe together, via electrical conduction through the contact location, thereby establishing continuity between the first probe and the second probe.

Ceasing the operatively translating at 135 may include ceasing motion of the substrate, ceasing motion of the substrate along the contacting axis, and/or ceasing motion of the substrate toward the probe assembly. Additionally or alternatively, the ceasing at 135 may include ceasing motion of the probe assembly, ceasing motion of the probe assembly along the contacting axis, and/or ceasing motion of the probe assembly toward the substrate. The ceasing at 135 may be responsive to, or initiated based, at least in part, on, electrical contact between the contact location and both the first probe and the second probe. As an example, the ceasing at 135 may be responsive to detecting continuity between the first probe and the second probe.

It is within the scope of the present disclosure that the ceasing at 135 may be initiated, or initiated immediately, upon detection of continuity between the first probe and the second probe. Additionally or alternatively, it also is within the scope of the present disclosure that the probe system may be configured to provide a predetermined, pre-established, and/or desired amount of overdrive, or additional motion, subsequent to detection of continuity between the first probe and the second probe. Subsequent to the overdrive, a distance between the substrate and the probe assembly may be less than a distance between the substrate and the probe assembly at which continuity initially is detected, and this overdrive may increase, or provide a desired amount of, contact force between the contact location and both the first probe and the second probe.

Electrically testing operation of the DUT at 140 may include electrically testing via and/or utilizing the first probe and the second probe. As an example, and as discussed herein with reference to FIGS. 1-2, the first probe may include, or be, a force probe and the second probe may include, or be, a sense probe. Under these conditions, the electrically testing at 140 may include providing a test signal to the DUT, via the contact location, utilizing the first probe and concurrently measuring a voltage, potential, and/or electrical potential of the contact location utilizing the second probe.

Measuring the temperature of the substrate at 145 may include measuring with a thermal detector of the probe assembly, examples of which are disclosed herein with reference to thermal detector 86 of FIGS. 1-2. When methods 100 include the measuring at 145, the electrically testing at 140 further may include correlating electrical performance of the DUT to the temperature of the substrate.

Operatively translating the substrate and the probe assembly away from one another at 150 may include operatively translating along the contacting axis. The operatively translating at 150 may include increasing a distance, or space, between the substrate and the probe assembly. Additionally or alternatively, the operatively translating at 150 may include ceasing electrical contact between the contact location of the DUT and both the first probe and the second probe, separating the first probe from the contact location, and/or separating the second probe from the contact location. When methods 100 include the operatively translating at 150 and the operatively aligning at 120, the operatively translating at 150 may be performed prior to the operatively aligning at 120, such as to permit and/or facilitate the operatively aligning at 120.

Repeating at least the portion of the methods at 155 may include repeating any suitable portion of methods 100 in any suitable manner. As an example, the test temperature may be a first test temperature, and repeating at 155 may include repeating to test the operation of the DUT at a second test temperature that is different from the first test temperature. Under these conditions, and subsequent to the electrically testing at 140, the repeating at 155 may include repeating the setting at 110 to set the temperature of the DUT to a second test temperature that is different from the first test temperature. As examples, the second test temperature may differ from the first test temperature by a temperature differential of at least 10° C., at least 20° C., at least 30° C., at least 40° C., at least 50° C., at least 75° C., or at least 100° C.

The repeating the setting at 110 may be performed subsequent to the operatively translating at 150, if performed. Stated another way, the temperature of the DUT may be changed when the contact location of the DUT is not in electrical contact with the first probe and/or with the second probe. However, this is not required of all embodiments.

When the repeating the setting at 110 is performed while the contact location is not in contact with the first probe and the second probe (i.e., subsequent to the operatively translating at 150), the repeating at 155 subsequently may include repeating, or continuing, the providing at 105, repeating the monitoring at 115, repeating the operatively aligning at 120, repeating the operatively translating at 125, repeating the detecting at 130, and/or repeating the ceasing at 135 to establish electrical contact between the contact location and both the first probe and the second probe while the substrate is at the second test temperature. Subsequently, the repeating at 155 further may include repeating the electrically testing at 140 to electrically test the operation of the DUT at the second test temperature and also may include repeating the measuring at 145 to measure, or quantify, the second test temperature of the DUT.

As another example, the DUT may be a first DUT of the plurality of DUTs, and the repeating at 155 may include repeating to test the operation of a second DUT of the plurality of DUTs. Under these conditions, the repeating at 155 may include repeating, or continuing, the providing at 105 and/or repeating the setting at 110 to set a temperature of the second DUT to a corresponding test temperature. The repeating at 155 additionally or alternatively may include repeating the monitoring at 115 and/or repeating the operatively aligning at 120 to operatively align the first probe and the second probe with a corresponding contact location of the second DUT. The repeating at 155 additionally or alternatively may include repeating the operatively translating at 125 and/or repeating the detecting at 130, with the detecting at 130 being responsive to electrical contact being established between the corresponding contact location of the second DUT and both the first probe and the second probe. The repeating at 155 additionally or alternatively may include repeating the ceasing at 135 to cease motion of the substrate and the probe assembly, relative to one another, responsive to electrical contact between the corresponding contact location of the second DUT and both the first probe and the second probe. Subsequently, methods 100 may include repeating the electrically testing at 140 to test the operation of the second DUT and also may include repeating the measuring at 145 to measure the temperature of the substrate at, near, and/or proximal the second DUT.

In the present disclosure, several of the examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" may mean A alone, B alone, C alone, A and B together, A and C together, B and C together, A, B, and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It also is within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

Illustrative, non-exclusive examples of probe systems and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A probe system for electrically testing a device under test (DUT), the probe system comprising:

a probe assembly including a first probe and a second probe;

a chuck including a support surface configured to support the DUT;

a translation structure configured to operatively translate at least one of the probe assembly and the chuck along a contacting axis that optionally is perpendicular, or at least substantially perpendicular, to the support surface;

an instrumentation package configured to detect contact between the probe system and the DUT and to test the operation of the DUT;

a first probe electrical conductor extending between and electrically interconnecting the first probe and the instrumentation package;

a second probe electrical conductor extending between and electrically interconnecting the second probe and the instrumentation package; and a translation structure communication linkage extending between the translation structure and the instrumentation package;

wherein the instrumentation package includes:

(i) a continuity detection circuit in electrical communication with the first probe electrical conductor and the second probe electrical conductor and configured to detect electrical contact between a contact location of the DUT and both the first probe and the second probe of the probe assembly by detecting electrical continuity between the first probe electrical conductor and the second probe electrical conductor;

(ii) a test circuit configured to electrically test the operation of the DUT; and (iii) a translation structure control circuit configured to control the operation of the translation structure based, at least in part, on the continuity detection circuit.

A2. The probe system of paragraph A1, wherein the probe assembly includes, and optionally is, a probe card.

A3. The probe system of any of paragraphs A1-A2, wherein the first probe is a force probe, wherein the second probe is a sense probe, wherein the contact location is a source contact location, and further wherein the probe assembly includes a gate probe configured to electrically contact a gate contact location of the DUT.

A4. The probe system of paragraph A3, wherein the probe assembly includes, and optionally is, an anti-arcing probe card configured to resist arcing between and/or among any two of the force probe, the sense probe, and the gate probe when the probe system electrically tests the DUT.

A5. The probe system of paragraph A4, wherein the probe system further includes a fluid supply system configured to supply a fluid stream between the anti-arcing probe card and the DUT when the probe system electrically tests the DUT, optionally wherein the fluid stream includes, or is, at least one of a pressurized fluid stream, a gas stream, a pressurized gas stream, an air stream, a pressurized air stream, a liquid stream, and a pressurized liquid stream.

A6. The probe system of paragraph A5, wherein the anti-arcing probe card and a substrate together define a partially enclosed volume, or region, and further wherein the anti-arcing probe card is configured to supply the fluid stream to the partially enclosed volume, or region.

A7. The probe system of any of paragraphs A5-A6, wherein the fluid supply system includes at least one of:
  (i) a fluid source configured to generate the fluid stream; and
  (ii) a fluid conduit extending between the fluid source and the anti-arcing probe card and configured to provide the fluid stream to the anti-arcing probe card.

A8. The probe system of any of paragraphs A5-A7, wherein the fluid supply system is configured to supply the fluid stream at a pressure of at least one of:
  (i) at least 0.1 megapascals (MPa), at least 0.2 MPa, at least 0.3 MPa, at least 0.4 MPa, at least 0.5 MPa, or at least 0.6 MPa; and
  (ii) at most 1 MPa, at most 0.9 MPa, at most 0.8 MPa, at most 0.7 MPa, at most 0.6 MPa, or at most 0.5 MPa.

A9. The probe system of any of paragraphs A1-A8, wherein the instrumentation package further includes, or instead includes:
  a measurement instrument configured to electrically test the DUT;
  a contact-sensing assembly configured to detect electrical contact between the contact location of the DUT and both the first probe and the second probe; and
  a switch including:
  (i) a testing state in which the switch selectively and electrically interconnects the first probe electrical conductor and the second probe electrical conductor with the measurement instrument and electrically isolates the first probe electrical conductor and the second probe electrical conductor from the contact-sensing assembly; and
  (ii) a contact-sensing state in which the switch selectively and electrically interconnects the first probe electrical conductor and the second probe electrical conductor with the contact-sensing assembly and electrically isolates the first probe electrical conductor and the second probe electrical conductor from the measurement instrument.

A10. The probe system of paragraph A9, wherein the switch further includes an isolation state in which the switch selectively and electrically isolates the first probe electrical conductor and the second probe electrical conductor from both the contact-sensing assembly and the measurement instrument, optionally wherein the isolation state is configured to facilitate calibration of the probe system.

A11. The probe system of any of paragraphs A9-A10, wherein the measurement instrument is configured to generate a high-voltage test signal for electrically testing the DUT, optionally wherein the high-voltage test signal at least one of:
  (i) has a minimum test voltage of at least 0.5 kilovolts (kV), at least 1 kV, at least 2 kV, at least 4 kV, at least 6 kV, at least 8 kV, or at least 10 kV; and
  (ii) has a maximum test voltage of at most 20 kV, at most 15 kV, at most 12.5 kV, at most 10 kV, at most 7.5 kV, or at most 5 kV.

A12. The probe system of any of paragraphs A1-A11, wherein the contact-sensing assembly is configured to generate a contact-sensing voltage differential between the first probe electrical conductor and the second probe electrical conductor at a contact-sensing voltage, optionally wherein the contact-sensing voltage at least one of:
  (i) has a minimum contact-sensing voltage of at least 0.1 volts (V), at least 0.2 V, at least 0.4 V, at least 0.6 V, at least 0.8 V, at least 1 V, at least 2 V, or at least 5 V; and
  (ii) has a maximum contact-sensing voltage of at most 20 V, at most 15 V, at most 10 V, at most 7.5 V, at most 5 V, at most 2.5V, or at most 1 V.

A13. The probe system of paragraph A12, wherein the probe system further includes a drain electrical conductor configured to electrically interconnect a back side of the DUT with the measurement instrument.

A14. The probe system of any of paragraphs A1-A13, wherein the probe assembly further includes a thermal detector configured to detect a temperature of the DUT.

A15. The probe system of paragraph A14, wherein the thermal detector includes at least one of:
  (i) a thermocouple;
  (ii) a thermistor;
  (iii) an RTD; and
  (iv) an infrared detector.

A16. The probe system of any of paragraphs A1-A15, wherein the chuck includes, and optionally is, a temperature-controlled chuck.

A17. The probe system of any of paragraphs A1-A16, wherein the probe system further includes a chuck thermal module configured to regulate a temperature of the chuck within a chuck temperature range.

A18. The probe system of paragraph A17, wherein the chuck temperature range includes at least one of:
  (i) a minimum temperature of at most −200° C., at most −150° C., at most −100° C., at most −50° C., or at most 0° C.; and
  (ii) a maximum temperature of at least 50° C., at least 100° C., at least 150° C., at least 200° C., at least 250° C., or at least 300° C.

A19. The probe system of any of paragraphs A1-A18, wherein the translation structure includes a chuck translation structure configured to operatively translate the chuck relative to the probe assembly.

A20. The probe system of any of paragraphs A1-A19, wherein the translation structure includes a probe assembly translation structure configured to operatively translate the probe assembly relative to the chuck.

A21. The probe system of any of paragraphs A1-A20, wherein the translation structure is configured to:
  (i) selectively establish electrical communication between the contact location of the DUT and both the first probe and the second probe by at least one of moving the probe assembly toward the chuck along the contacting axis and moving the chuck toward the probe assembly along the contacting axis; and
  (ii) selectively cease electrical communication between the contact location of the DUT and both the first probe and the second probe by at least one of moving the probe assembly away from the chuck along the contacting axis and moving the chuck away from the probe assembly along the contacting axis.

A22. The probe system of any of paragraphs A1-A21, wherein the continuity detection circuit is configured to generate a contact signal indicative of a state of contact between the contact location of the DUT and both the first probe and the second probe, and further wherein the translation structure control circuit is configured to control the operation of the translation structure based, at least in part, on the contact signal.

A23. The probe system of any of paragraphs A1-A22, wherein the test circuit is configured to:
 (i) provide a test signal to the DUT;
 (ii) receive a resultant signal from the DUT; and
 (iii) quantify operation of the DUT based, at least in part, on at least one, and optionally both, of the test signal and the resultant signal.

A24. The probe system of any of paragraphs A1-A23, wherein the probe system includes the substrate.

A25. The probe system of paragraph A24, wherein the contact location includes at least one of a contact pad and a solder bump.

B1. A method of electrically testing a device under test (DUT), which is formed on a substrate, with a probe system, which includes a probe assembly, the method comprising:
 monitoring a continuity between a first probe of the probe assembly of the probe system and a second probe of the probe assembly;
 during the monitoring, operatively translating the substrate and the probe assembly toward one another to establish electrical contact between a contact location of the DUT and both the first probe and the second probe;
 responsive to electrical contact between the contact location and both the first probe and the second probe, detecting continuity between the first probe and the second probe;
 responsive to the detecting, ceasing the operatively translating; and
 subsequent to the ceasing, utilizing the first probe and the second probe to electrically test operation of the DUT.

B2. The method of paragraph B1, wherein the method further includes providing a fluid stream to a pressurized region extending between the probe assembly and the DUT to resist arcing during the utilizing.

B3. The method of any of paragraphs B1-B2, wherein, optionally prior to the utilizing, the method further includes setting a temperature of the DUT to a test temperature.

B4. The method of paragraph B3, wherein the test temperature is a first test temperature, and further wherein, subsequent to the utilizing, the method includes repeating the setting to set the temperature of the DUT to a second test temperature that is different from the first test temperature.

B5. The method of paragraph B4, wherein, prior to the repeating the setting, the method further includes operatively translating the substrate and the probe assembly away from one another to cease electrical contact between the contact location of the DUT and both the first probe and the second probe, and further wherein, subsequent to the repeating the setting, the method includes:
 (i) repeating the monitoring to monitor the continuity between the first probe and the second probe;
 (ii) repeating the operatively translating the substrate and the probe assembly toward one another to establish electrical contact between the contact location of the DUT and both the first probe and the second probe;
 (iii) responsive to electrical contact between the contact location and both the first probe and the second probe, repeating the detecting continuity between the first probe and the second probe;
 (iv) responsive to the repeating the detecting continuity, repeating the ceasing the operatively translating; and
 (v) subsequent to the repeating the ceasing, repeating the utilizing the first probe and the second probe to electrically test the operation of the DUT at the second test temperature.

B6. The method of paragraph B5, wherein the first test temperature and the second test temperature differ by a temperature differential of at least 10° C., at least 20° C., at least 30° C., at least 40° C., at least 50° C., at least 75° C., or at least 100° C.

B7. The method of any of paragraphs B1-B6, wherein the DUT is a first DUT of a plurality of DUTs, and further wherein, subsequent to the utilizing, the method includes:
 (i) operatively aligning the probe assembly with a second DUT of the plurality of DUTs;
 (ii) repeating the monitoring the continuity between the first probe and the second probe;
 (iii) repeating the operatively translating the substrate and the probe assembly toward one another;
 (iv) repeating the detecting continuity to detect continuity between a corresponding contact location of the second DUT and both the first probe and the second probe;
 (v) repeating the ceasing the operatively translating responsive to electrical contact between the corresponding contact location of the second DUT and both the first probe and the second probe; and
 (vi) repeating the utilizing to electrically test operation of the second DUT.

B8. The method of any of paragraphs B1-B7, wherein the DUT is a first DUT, and further wherein, subsequent to the utilizing, the method includes repeating the method to electrically test the operation of a second DUT of the plurality of DUTs.

B9. The method of any of paragraphs B1-B8, wherein, during the utilizing, the method further includes measuring a temperature of the substrate with a thermal detector of the probe assembly, optionally to correlate electrical performance of the DUT to the temperature of the substrate.

B10. The method of any of paragraphs B1-B9, wherein the probe system includes the probe system of any of paragraphs A1-A25.

INDUSTRIAL APPLICABILITY

The probe systems and methods disclosed herein are applicable to the semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, when the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of those claims or presentation of new claims in that or a related application. Such amended or new claims, whether they are directed to a different invention or directed to the same invention, whether different, broader, narrower or equal in scope to the original claims, are also regarded as included within the subject matter of the inventions of the present disclosure.

The invention claimed is:

1. A probe system for electrically testing a device under test (DUT), the probe system comprising:
    a probe assembly including a first probe and a second probe;
    a chuck including a support surface configured to support the DUT;
    a translation structure configured to operatively translate at least one of the probe assembly and the chuck along a contacting axis;
    an instrumentation package configured to detect contact between the probe system and the DUT and to test the operation of the DUT;
    a first probe electrical conductor extending between and electrically interconnecting the first probe and the instrumentation package;
    a second probe electrical conductor extending between and electrically interconnecting the second probe and the instrumentation package; and
    a translation structure communication linkage extending between the translation structure and the instrumentation package;
    wherein the instrumentation package includes:
        (i) a continuity detection circuit in electrical communication with the first probe electrical conductor and the second probe electrical conductor and configured to detect electrical contact between a contact location of the DUT and both the first probe and the second probe of the probe assembly by detecting electrical continuity between the first probe electrical conductor and the second probe electrical conductor;
        (ii) a test circuit configured to electrically test the operation of the DUT; and
        (iii) a translation structure control circuit configured to control the operation of the translation structure based, at least in part, on the continuity detection circuit;
        (iv) a measurement instrument configured to electrically test the DUT;
        (v) a contact-sensing assembly configured to detect electrical contact between the contact location of the DUT and both the first probe and the second probe; and
        (vi) a switch including:
            (a) a testing state in which the switch selectively and electrically interconnects the first probe electrical conductor and the second probe electrical conductor with the measurement instrument and electrically isolates the first probe electrical conductor and the second probe electrical conductor from the contact-sensing assembly; and
            (b) a contact-sensing state in which the switch selectively and electrically interconnects the first probe electrical conductor and the second probe electrical conductor with the contact-sensing assembly and electrically isolates the first probe electrical conductor and the second probe electrical conductor from the measurement instrument.

2. The probe system of claim 1, wherein the first probe is a force probe, wherein the second probe is a sense probe, wherein the contact location is a source contact location, and further wherein the probe assembly includes a gate probe configured to electrically contact a gate contact location of the DUT.

3. The probe system of claim 2, wherein the probe assembly includes an anti-arcing probe card configured to resist arcing between two of the force probe, the sense probe, and the gate probe when the probe system electrically tests the DUT, and further wherein the probe system includes a fluid supply system configured to supply a fluid stream between the anti-arcing probe card and the DUT when the probe system electrically tests the DUT.

4. The probe system of claim 3, wherein the anti-arcing probe card and a substrate together define a partially enclosed volume and further wherein the anti-arcing probe card is configured to supply the fluid stream to the partially enclosed volume.

5. The probe system of claim 1, wherein the switch further includes an isolation state in which the switch selectively and electrically isolates the first probe electrical conductor and the second probe electrical conductor from both the contact-sensing assembly and the measurement instrument.

6. The probe system of claim 1, wherein the contact-sensing assembly is configured to generate a contact-sensing voltage differential between the first probe electrical conductor and the second probe electrical conductor at a contact-sensing voltage, wherein the contact-sensing voltage is at least 0.1 volts (V) and at most 20 V.

7. The probe system of claim 6, wherein the probe system further includes a drain electrical conductor configured to electrically interconnect a back side of the DUT with the measurement instrument.

8. The probe system of claim 1, wherein the probe assembly further includes a thermal detector configured to detect a temperature of the DUT.

9. The probe system of claim 1, wherein the probe system further includes a chuck thermal module configured to regulate a temperature of the chuck within a chuck temperature range, wherein the chuck temperature range includes a minimum temperature of at most 0 ° C. and a maximum temperature of at least 50° C.

10. The probe system of claim 1, wherein the continuity detection circuit is configured to generate a contact signal indicative of a state of contact between the contact location of the DUT and both the first probe and the second probe, and further wherein the translation structure control circuit is configured to control the operation of the translation structure based, at least in part, on the contact signal.

11. A method of utilizing the probe system of claim 1 to electrically test the DUT, wherein the DUT is formed on a substrate, the method comprising:
    monitoring the electrical continuity between the first probe electrical conductor and the second probe electrical conductor with the continuity detection circuit;
    during the monitoring, operatively translating the substrate and the probe assembly toward one another, via the translation structure control circuit, to establish electrical contact between the contact location of the DUT and both the first probe and the second probe;
    responsive to electrical contact between the contact location and both the first probe and the second probe, detecting continuity between the first probe electrical conductor and the second probe electrical conductor with the continuity detection circuit;
    responsive to the detecting, ceasing the operatively translating; and subsequent to the ceasing, utilizing the first probe and the second probe to electrically test operation of the DUT with the test circuit.

12. A method of electrically testing a device under test (DUT), which is formed on a substrate, with a probe system, which includes a probe assembly, the method comprising:
monitoring a continuity between a first probe of the probe assembly of the probe system and a second probe of the probe assembly;
during the monitoring, operatively translating the substrate and the probe assembly toward one another to establish electrical contact between a contact location of the DUT and both the first probe and the second probe;
responsive to electrical contact between the contact location and both the first probe and the second probe, detecting continuity between the first probe and the second probe;
responsive to the detecting, ceasing the operatively translating;
subsequent to the ceasing, utilizing the first probe and the second probe to electrically test operation of the DUT; and
providing a fluid stream to a pressurized region extending between the probe assembly and the DUT to resist arcing during the utilizing.

13. The method of claim 12, wherein, prior to the utilizing, the method further includes setting a temperature of the DUT to a test temperature.

14. The method of claim 13, wherein the test temperature is a first test temperature, and further wherein, subsequent to the utilizing, the method includes repeating the setting to set the temperature of the DUT to a second test temperature that is different from the first test temperature.

15. The method of claim 14, wherein, prior to the repeating the setting, the method further includes operatively translating the substrate and the probe assembly away from one another to cease electrical contact between the contact location of the DUT and both the first probe and the second probe, and further wherein, subsequent to the repeating the setting, the method includes:
(i) repeating the monitoring to monitor the continuity between the first probe and the second probe;
(ii) repeating the operatively translating the substrate and the probe assembly toward one another to establish electrical contact between the contact location of the DUT and both the first probe and the second probe;
(iii) responsive to electrical contact between the contact location and both the first probe and the second probe, repeating the detecting continuity between the first probe and the second probe;
(iv) responsive to the repeating the detecting continuity, repeating the ceasing the operatively translating; and
(v) subsequent to the repeating the ceasing, repeating the utilizing the first probe and the second probe to electrically test the operation of the DUT at the second test temperature.

16. The method of claim 15, wherein the first test temperature and the second test temperature differ by a temperature differential of at least 20° C.

17. The method of claim 12, wherein the DUT is a first DUT of a plurality of DUTs, and further wherein, subsequent to the utilizing, the method includes:
(i) operatively aligning the probe assembly with a second DUT of the plurality of DUTs;
(ii) repeating the monitoring the continuity between the first probe and the second probe;
(iii) repeating the operatively translating the substrate and the probe assembly toward one another;
(iv) repeating the detecting continuity to detect continuity between a corresponding contact location of the second DUT and both the first probe and the second probe;
(v) repeating the ceasing the operatively translating responsive to electrical contact between the corresponding contact location of the second DUT and both the first probe and the second probe; and
(vi) repeating the utilizing to electrically test operation of the second DUT.

18. The method of claim, 12, wherein the DUT is a first DUT of a plurality of DUTs, and further wherein, subsequent to the utilizing, the method includes repeating the method to electrically test the operation of a second DUT of the plurality of DUTs.

19. The method of claim 12, wherein, during the utilizing, the method further includes measuring a temperature of the substrate with a the mal detector of the probe assembly, and further wherein the method includes correlating electrical performance of the DUT to the temperature of the substrate.

20. A probe system for electrically testing a device under test (DUT), the probe system comprising:
a probe assembly including a first probe and a second probe, wherein the first probe is a force probe, and further wherein the second probe is a sense probe;
a chuck including a support surface configured to support the DUT;
a translation structure configured to operatively translate at least one of the probe assembly and the chuck along a contacting axis;
an instrumentation package configured to detect contact between the probe system and the DUT and to test the operation of the DUT;
a first probe electrical conductor extending between and electrically interconnecting the first probe and the instrumentation package;
a second probe electrical conductor extending between and electrically interconnecting the second probe and the instrumentation package; and
a translation structure communication linkage extending between the translation structure and the instrumentation package;
wherein the instrumentation package includes:
(i) a continuity detection circuit in electrical communication with the first probe electrical conductor and the second probe electrical conductor and configured to detect electrical contact between a contact location of the DUT and both the first probe and the second probe of the probe assembly by detecting electrical continuity between the first probe electrical conductor and the second probe electrical conductor;
(ii) a test circuit configured to electrically test the operation of the DUT; and
(iii) a translation structure control circuit configured to control the operation of the translation structure based, at least in part, on the continuity detection circuit; and
wherein:
(i) the contact location is a source contact location;
(ii) the probe assembly includes a gate probe configured to electrically contact a gate contact location of the DUT;
(iii) the probe assembly includes an anti-arcing probe card configured to resist arcing between two of the force probe, the sense probe, and the gate probe when the probe system electrically tests the DUT; and (iv) the probe system includes a fluid supply system configured to supply a fluid stream between the anti-arcing probe card and the DUT when the probe system electrically tests the DUT.

21. The probe system of claim 20, wherein the anti-arcing probe card and a substrate together define a partially enclosed volume and further wherein the anti-arcing probe card is configured to supply the fluid stream to the partially enclosed volume.

* * * * *

UNITED STATES PATENT AND TRADEMARK OFFICE
CERTIFICATE OF CORRECTION

PATENT NO. : 10,330,703 B2
APPLICATION NO. : 15/934672
DATED : June 25, 2019
INVENTOR(S) : Sia Choon Beng and Kazuki Negishi Page 1 of 1

It is certified that error appears in the above-identified patent and that said Letters Patent is hereby corrected as shown below:

In the Claims

Claim 9, Column 20, Line 39, please delete the space between "°" and "C".

Claim 16, Column 21, Line 60, please delete the space between "°" and "C".

Claim 19, Column 22, Line 20, please delete "the mal" and insert --thermal-- therefor.

Signed and Sealed this
Twelfth Day of November, 2019

Andrei Iancu
*Director of the United States Patent and Trademark Office*